United States Patent [19]

Ishii et al.

[11] Patent Number: 5,315,212
[45] Date of Patent: May 24, 1994

[54] PLASMA PROCESSING APPARATUS FOR GENERATING UNIFORM STRIP-SHAPED PLASMA BY PROPAGATING MICROWAVE THROUGH RECTANGULAR SLIT

[75] Inventors: Akira Ishii, Amagasaki; Syoichiro Minomo, Takatsuki; Michio Taniguchi, Kobe; Masato Sugiyo, Izumi, all of Japan

[73] Assignee: Daihen Corporation, Japan

[21] Appl. No.: 8,729

[22] Filed: Feb. 12, 1993

[30] Foreign Application Priority Data

Mar. 30, 1992 [JP] Japan .................. 4-105679
Aug. 28, 1992 [JP] Japan .................. 4-253666

[51] Int. Cl.⁵ .............................................. H01J 7/24
[52] U.S. Cl. ...................... 315/111.51; 333/99 PL; 118/719
[58] Field of Search ............. 315/111.51, 111.21; 333/99 PL; 118/50.1, 620, 719

[56] References Cited

U.S. PATENT DOCUMENTS

| 4,430,138 | 2/1984 | Suzuki et al. |
| 4,512,868 | 4/1985 | Fujimura et al. |
| 4,641,060 | 2/1987 | Dandl ............................ 315/111.21 |
| 4,776,918 | 10/1988 | Otsubo et al. |
| 5,002,793 | 3/1991 | Arai ................................ 118/719 |
| 5,107,170 | 4/1992 | Ishikawa et al. ............... 315/111.21 |
| 5,182,495 | 1/1993 | Fukuda et al. ................. 315/111.21 |

FOREIGN PATENT DOCUMENTS 0183561 11/1985 European Pat. Off.
0335675 3/1989 European Pat. Off.
0480273 9/1991 European Pat. Off.
2110870 12/1982 United Kingdom.

Primary Examiner—John T. Kwon
Attorney, Agent, or Firm—Scully, Scott, Murphy & Presser

[57] ABSTRACT

In a plasma processing apparatus including a plasma chamber having a strip-shaped rectangular window having a longitudinal length formed in a side wall of the plasma chamber, an object to be processed is provided within the plasma chamber so as to be close to the window. The plasma processing apparatus includes a coupling rectangular waveguide having a strip-shaped rectangular slit formed in an E-plane thereof so as to extend in a direction of an axis thereof, wherein the coupling rectangular waveguide is provided so that the direction of the axis of the coupling rectangular waveguide is parallel to the longitudinal direction of the window of the plasma chamber. A coupling member made of a material for propagating a microwave is mounted between the slit of the coupling rectangular waveguide and the window of the plasma chamber, and electromagnetically couples the slit with the window in an airtight state. Further, a microwave generating unit is connected to the coupling rectangular waveguide to generate and supply a microwave into the coupling rectangular waveguide, thereby propagating the microwave through the slit of the coupling rectangular waveguide, the coupling member and the window of the plasma chamber into the plasma chamber.

29 Claims, 13 Drawing Sheets

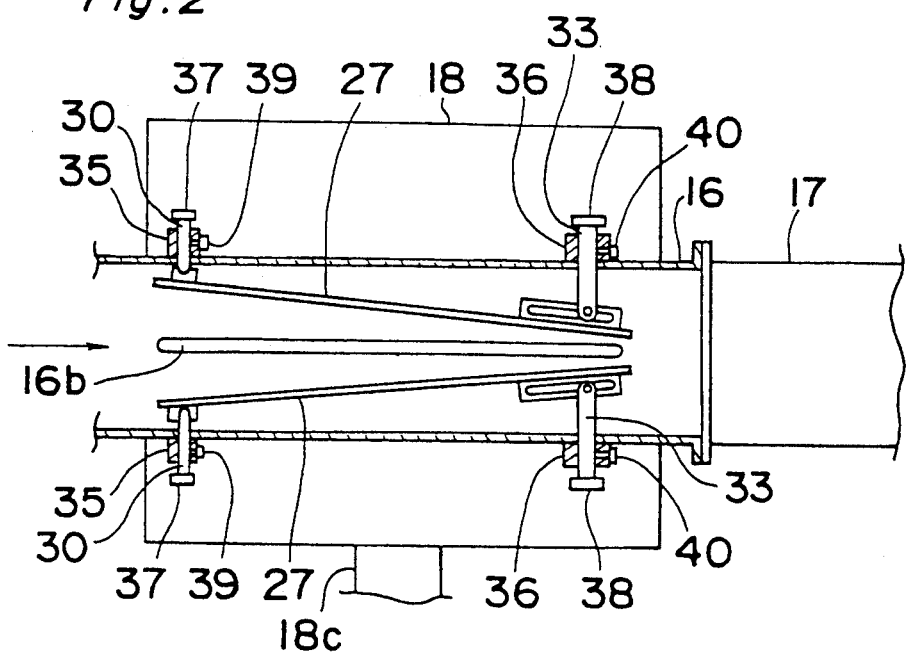
Fig. 2
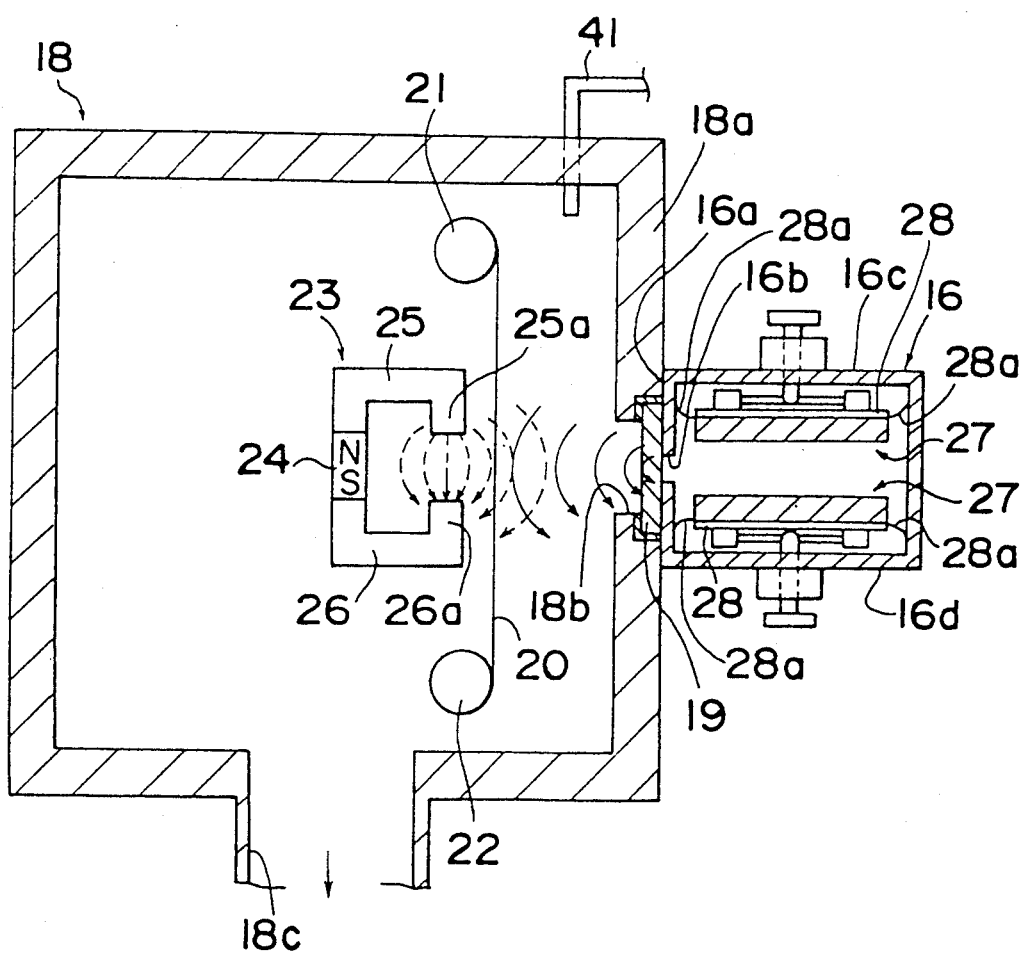
Fig. 3 III-III'

Fig. 6 III-III'

Fig. 9
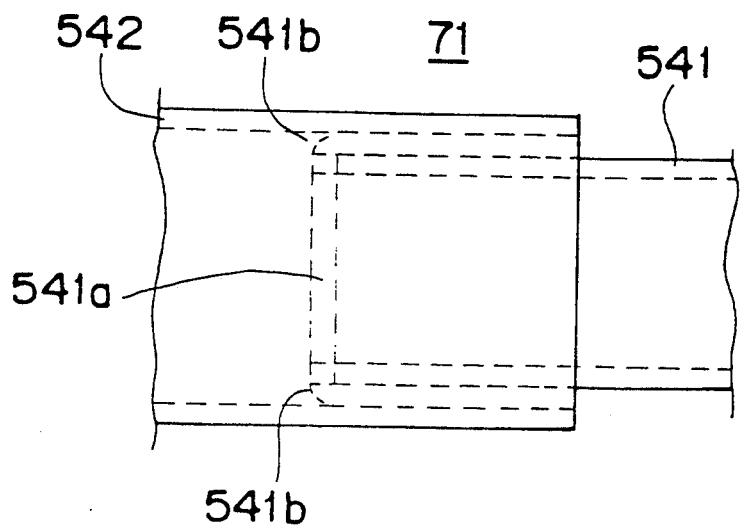
Fig. 10 VII-VII'
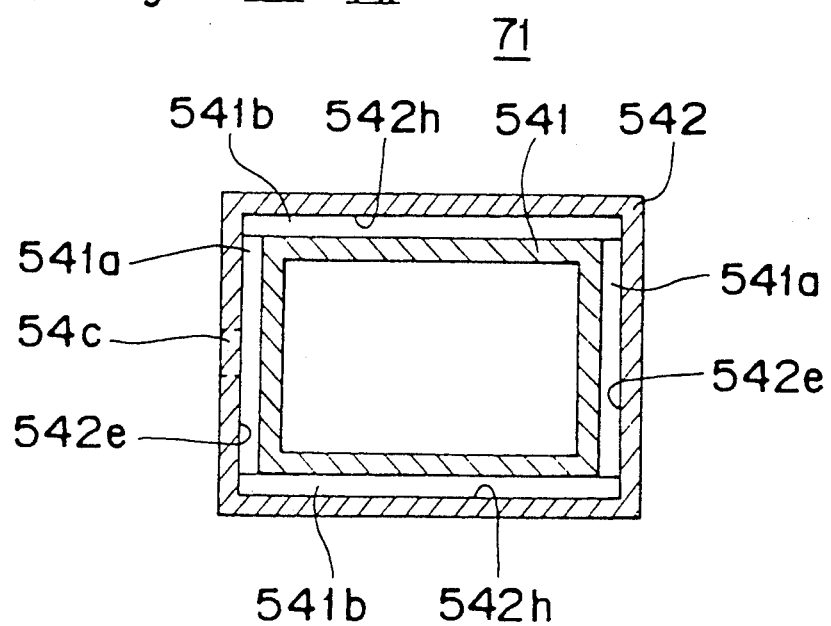

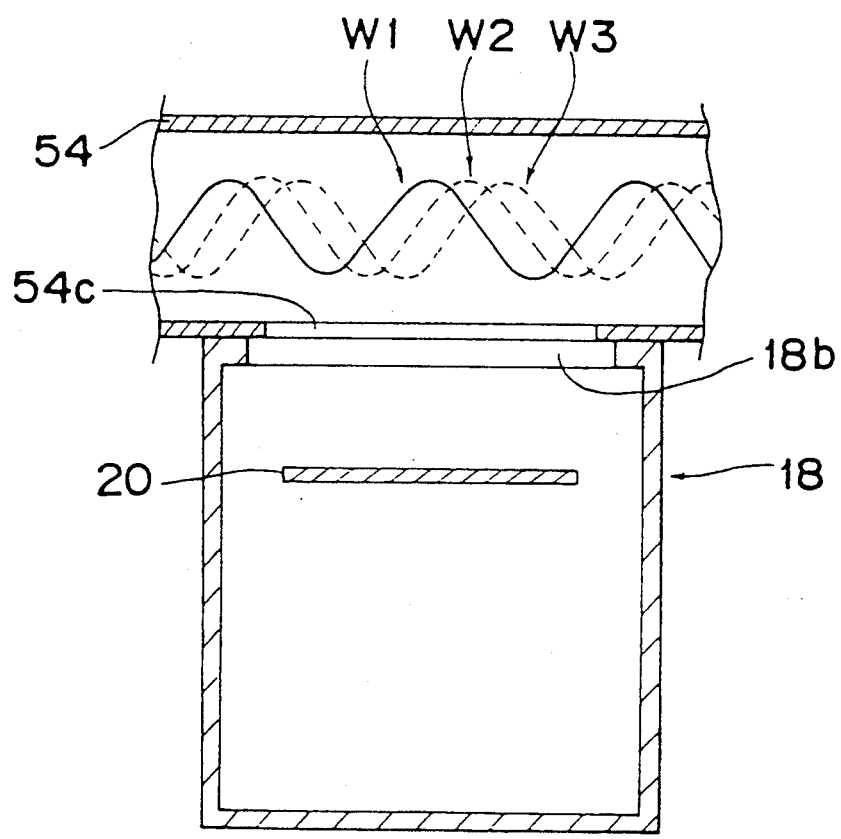

PLASMA PROCESSING APPARATUS FOR GENERATING UNIFORM STRIP-SHAPED PLASMA BY PROPAGATING MICROWAVE THROUGH RECTANGULAR SLIT

BACKGROUND OF THE INVENTION

1. Field of the Invention

The present invention relates to a plasma processing apparatus for generating a uniform strip-shaped plasma, and more particularly, to a plasma processing apparatus for performing a plasma process such as a chemical vapor deposition (CVD) process, an ashing process, a sputtering process, an etching process or the like by projecting a generated plasma onto an object to be processed, wherein the plasma is generated by supplying a microwave within a plasma chamber in which a predetermined processing gas is contained at a predetermined pressure.

2. Description of the Related Art

Conventionally, a method of forming a diamond film on a mechanical tool, a magnetic film or the like as a protection film has been developed, and in the conventional method, a plasma is used in order to form the protection film uniformly in a high speed at a low temperature. Further, conventionally, a plasma has been used upon etching a film in one of processes for manufacturing an LSI and a liquid crystal display unit.

FIG. 18 shows the whole composition of a conventional plasma processing apparatus.

Referring to FIG. 18, the conventional plasma processing apparatus comprises a microwave generator 1, an isolator 2, a directional coupler 3, an impedance matching unit 4, a corner rectangular waveguide 5, rectangular waveguides 6 and 7, and a terminating unit 8 including a movable short-circuit plate 8a which are connected in series to each other, and further comprises a silica tube 9 mounted so as to pass through a through hole formed in the rectangular waveguide 7. The silica tube 9 is connected to a vacuum pump (not shown). After the vacuum pump makes the inner air of the silica tube 9 in a predetermined high vacuum state, and then a predetermined processing gas G is supplied into the silica tube 9 so that the inner pressure of the silica tube 9 becomes a predetermined pressure.

A microwave generated by the microwave generator 1 is supplied through the isolator 2, the directional coupler 3, the impedance matching unit 4, the corner rectangular waveguide 5 and the rectangular waveguide 6 into the rectangular waveguide 7. The microwave supplied within the rectangular waveguide 7 propagates through a tube wall of the silica tube 9 into a plasma chamber located within the silica tube 9, and then makes the processing gas supplied within the silica tube 9 in a plasma state so as to generate a plasma of the processing gas. An object to be processed is provided in the center of the rectangular waveguide 7 located within the silica tube 9 or on the downstream side of the generated plasma so as to be projected by the generated plasma.

Further, a plasma generating apparatus utilizing the Electron Cyclotron Resonance (ECR) (referred to as an ECR plasma generating apparatus hereinafter) has been used. In the ECR plasma generating apparatus, a microwave is supplied into a plasma chamber through a rectangular waveguide, and an air-core coil is provided so as to surround the plasma chamber. A magnetic field generated by exciting the air-core coil and the supplied microwave lead to the ECR phenomenon, thereby generating a plasma having a high density in a high vacuum state.

In order to improve the processing efficiency in performing a plasma process such as a process of forming a thin film, etching a film or the like, it has been necessary to provide a technique or method of performing the plasma process uniformly at a high speed at a low temperature by uniformly projecting a plasma onto an object having a relatively large area to be processed. Further, in a process for manufacturing a liquid crystal display performed in a manner similar to that of the process for manufacturing an LSI, as the size of the liquid crystal display is enlarged, it has been necessary to provide a technique or method of uniformly projecting the generated plasma onto a processing surface having a relatively large area of the object to be processed.

However, in the conventional plasma generating apparatuses, since there is caused a difference of the density of the plasma between the center of the plasma and the periphery thereof, a speed of forming a film and an etching speed at respective different parts of the object to be processed can not be uniform, and then it is difficult to manufacture a device having a good quality with a higher efficiency. Further, since the cross section of the plasma is generated in a shape of circle, the plasma process can not be efficiently performed in the case where the processing surface of the object to be processed has either a rectangular shape or a square shape.

As a method of generating a plasma having a larger diameter or area in the conventional plasma processing apparatus shown in FIG. 15, it is supposed to enlarge the diameter of the silica tube 9. However, since the diameter of the silica tube 9 is limited by the dimension of the waveguide determined depending on the wavelength of the used microwave, the diameter of the silica tube 9 can not be enlarged so as to process an enlarged object to be processed.

Further, in the ECR plasma generating apparatus, in order to enlarge the diameter of the generated plasma, it is necessary to enlarge the diameter of the air-core coil, resulting in enlarging the size of the ECR plasma generating apparatus. This results in that the enlarged ECR plasma generating apparatus can not be used for practical use.

SUMMARY OF THE INVENTION

An object of the present invention is therefore to provide a plasma processing apparatus capable of projecting a plasma onto the whole area of a processing larger rectangular surface of an object to be processed without enlarging the size of the plasma processing apparatus.

Another object of the present invention is to provide a plasma processing apparatus capable of uniformly and efficiently projecting a plasma onto an object to be processed in a speed higher than that of the conventional plasma processing apparatuses.

In order to achieve the aforementioned objective, according to one aspect of the present invention, there is provided a plasma processing apparatus comprising:

a plasma chamber having a strip-shaped rectangular window having a longitudinal length formed in a side wall of said plasma chamber, within which an object to be processed is provided so as to be close to said window of said plasma chamber;

a coupling rectangular waveguide having a strip-shaped rectangular slit formed in an E-plane thereof so as to extend in a direction of an axis thereof, said coupling rectangular waveguide being provided so that the direction of the axis of said coupling rectangular waveguide is parallel to the longitudinal direction of said window of said plasma chamber;

a coupling member, mounted between said slit of said coupling rectangular waveguide and said window of said plasma chamber, for electromagnetically coupling said slit with said window in an airtight state, said coupling member being made of a material for propagating a microwave; and microwave generating means, connected to said coupling rectangular waveguide, for generating and supplying a microwave into said coupling rectangular waveguide, thereby propagating the microwave through said slit of said coupling rectangular waveguide, said coupling member and said window of said plasma chamber into said plasma chamber.

According to another aspect of the present invention, said plasma processing apparatus further comprises microwave unifying means for substantially unifying the microwave propagating through said slit of said coupling rectangular waveguide along the longitudinal direction of said slit.

For example, said microwave unifying means comprises a pair of metal plates provided within said coupling rectangular waveguide so as to oppose to each other in parallel to a direction in which both H-planes of said coupling rectangular waveguide oppose to each other, and so as to be inclined from the longitudinal direction of said slit, wherein inclination angles of said pair of metal plates from the longitudinal direction of said slit are set so as to substantially unify the microwave propagating through said slit of said coupling rectangular waveguide along the longitudinal direction of said slit.

In another modification, said microwave unifying means comprises a metal plate provided within said coupling rectangular waveguide in parallel to a direction in which both H-planes of said coupling rectangular waveguide oppose to each other, and so as to be inclined from the longitudinal direction of said slit, wherein an inclination angle of said metal plate from the longitudinal direction of said slit is set so as to substantially unify the microwave propagating through said slit of said coupling rectangular waveguide along the longitudinal direction of said slit. Furthermore, in a further modification, said microwave unifying means comprises a metal plate provided within said coupling rectangular waveguide in parallel to a direction in which both E-planes of said coupling rectangular waveguide oppose to each other, and so as to be inclined from the longitudinal direction of said slit, wherein an inclination angle of said metal plate from the longitudinal direction of said slit is set so as to substantially unify the microwave propagating through said slit of said coupling rectangular waveguide along the longitudinal direction of said slit.

According to a further aspect of the present invention, said plasma processing apparatus further comprises a branch type rectangular waveguide, mounted between said microwave generating means and one end of said coupling rectangular waveguide and between said microwave generating means and another end of said coupling rectangular waveguide.

According to a still further aspect of the present invention, said plasma processing apparatus further comprises a pair of movable connecting means movably mounted respectively between said branch type rectangular waveguide and one end of said coupling rectangular waveguide and between said branch type rectangular waveguide and another end of said coupling rectangular waveguide, so as to change a length of the waveguide between said branch type rectangular waveguide and one end of said coupling rectangular waveguide and a length of another waveguide between said branch type rectangular waveguide and another end of said coupling rectangular waveguide, thereby a phase of a standing wave generated in said coupling rectangular waveguide when the microwave propagates in said coupling rectangular waveguide.

According to a still more further aspect of the present invention, said plasma processing apparatus further comprises magnetic field generating means for generating a magnetic field on a propagation path between said window of said plasma chamber and said object to be processed on which the microwave propagates through said window of said plasma chamber into said plasma chamber.

According to a more still further aspect of the present invention, said plasma processing apparatus further comprises divergent magnetic field generating means for generating a divergent magnetic field directing from the center of said window of said plasma chamber toward said plasma chamber.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 2 is a top plan view partially including a cross sectional view of a coupling rectangular waveguide 16 for coupling with a plasma chamber 18 and peripheral components thereof shown in FIG. 1;

FIG. 3 is an enlarged cross sectional view on line III—III' of FIG. 1 showing a plasma chamber 18;

FIG. 9 is an enlarged top plan view of a movable connection section of the second preferred embodiment;

FIG. 10 is an enlarged cross sectional view on line VII—VII' of FIG. 8 showing the movable connection section 71;

FIG. 11 is an enlarged cross sectional view on line VIII—VIII' of FIG. 8 showing a coupling rectangular waveguide 54 and the plasma chamber 18;

DETAILED DESCRIPTION OF THE PREFERRED EMBODIMENTS

The preferred embodiments according to the present invention will be described below with reference to the attached drawings.

FIRST PREFERRED EMBODIMENT

FIGS. 1 to 4 show a plasma processing apparatus of a first preferred embodiment according to the present invention.

Figure 1:
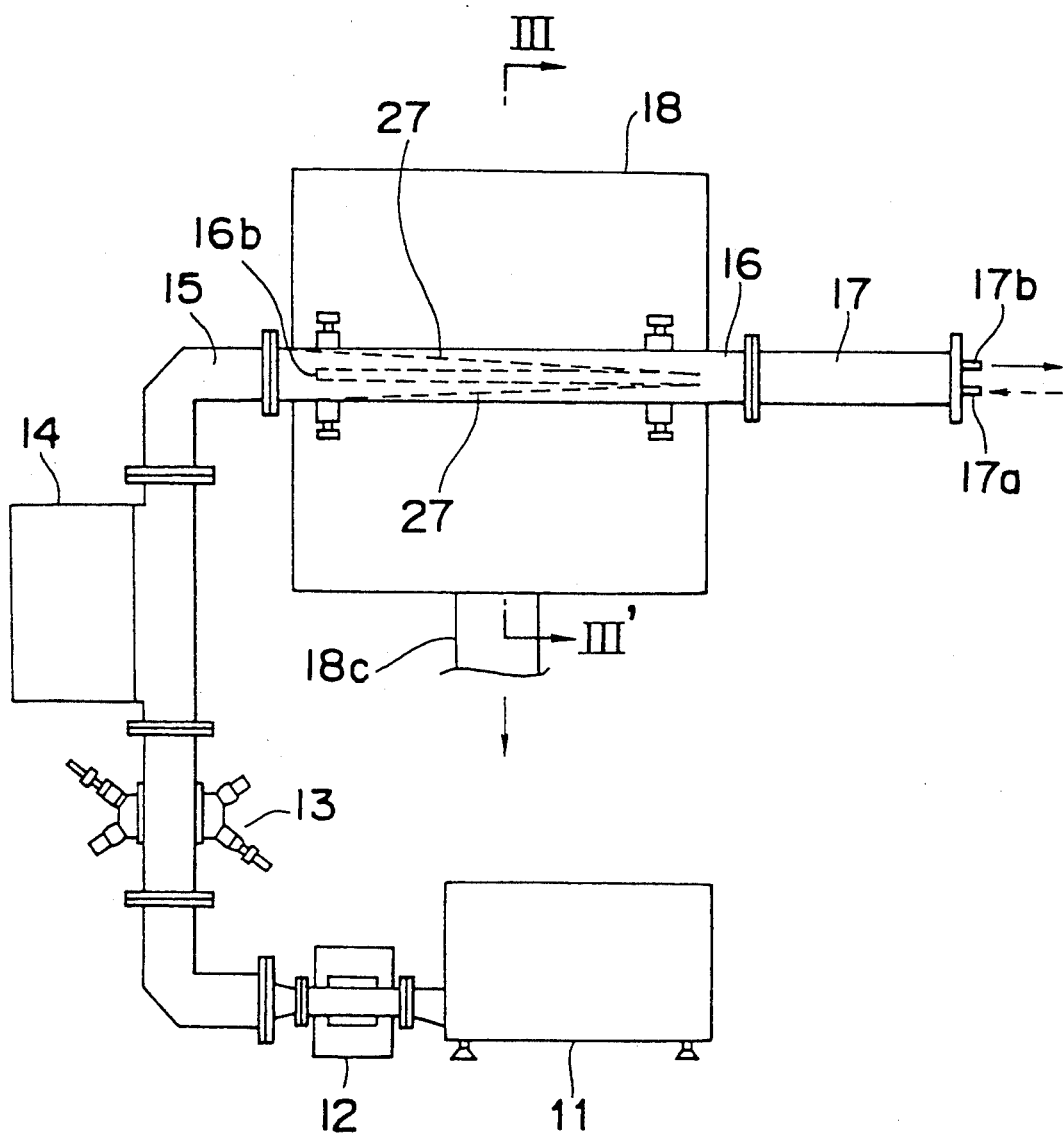
FIG. 1 is a top plan view showing the whole composition of a plasma processing apparatus of a first preferred embodiment according to the present invention.

Referring to FIG. 1, the plasma processing apparatus comprises a microwave generator 11 for generating a microwave, an output end of which is connected through an isolator 12, a directional coupler 13, an automatic impedance matching unit 14 and a corner rectangular waveguide 15 to one end of a rectangular waveguide 16 (referred to as a coupling rectangular waveguide hereinafter) for electromagnetically coupling with a plasma chamber 18. Another end of the coupling rectangular waveguide 16 is connected with a dummy load 17 for absorbing an extra remaining energy of the microwave. The dummy load 17 has not only an introduction port 17a through which a cooling water is flowed into the dummy load 17 but also an exhaust port 17b through which the exhaust cooling water is flowed therefrom. In the dummy load 17, the extra remaining energy of the microwave is absorbed by the cooling water flowed through the introduction port 17a thereinto, and then the cooling water heated by the microwave is flowed out therefrom through the exhaust port 17b.

Referring to FIG. 3, the plasma chamber 18 has either a cubic shape or a rectangular parallelepiped shape and an airtight structure, and is provided so that one side wall 18a of the plasma chamber 18 is in contact with one E-plane 16a of the rectangular waveguide 16 in parallel to the E plane 16a. In the side wall 18a of the plasma chamber 18, a strip-shaped rectangular window 18b having a longitudinal length is formed so as to pass through the side wall 18a and to extend in a direction of the axis of the rectangular waveguide 16 which is parallel to the longitudinal direction of the window 18b, and the window 18b is made in an airtight state with a silica glass plate 19 for propagating a microwave therethrough which is mounted in the window 18b so that an outer surface of the silica glass plate 19 is located on the same surface as an outer surface of the side wall 18a of the plasma chamber 18.

An exhaust port 18c is provided in the plasma chamber 18, and the exhaust port 18c is connected with a vacuum pump (not shown). On the other hand, an introduction pipe 41 for flowing a predetermined processing gas therethrough into the plasma chamber 18 is mounted on another wall of the plasma chamber 18 so as to be passed through the same wall in an airtight state. Within the plasma chamber 18, a pair of rollers 21 and 22 is provided so as to oppose to each other, wherein a sheet-shaped object 20 to be processed is wound around the roller 21 and the processed object 20 is wound up around the roller 22. The object 20 to be processed which extends from the roller 21 toward the roller 22 is provided so as to oppose to the window 18b, and has substantially the same width as a length in a longitudinal direction of the window 18b of the plasma chamber 18.

Further, in the plasma chamber 18, a magnetic field generating unit 23 is provided so as to oppose to the window 18b through the object 20 to be processed. The magnetic field generating unit 23 comprises a permanent magnet 24, and a pair of C-shaped magnetic pole pieces 25 and 26, respective one ends of which are connected to magnetic poles N and S of both ends of the permanent magnet 24. Magnetic pole parts 25a and 26a of another ends of the magnetic pole pieces 25 and 26 are provided at a position symmetrically with respect to the object 20 to be processed corresponding to the window 18b so as to oppose to each other in a direction parallel to the longitudinal direction of the object 20 to be processed.

The magnetic field generating unit 23 generates magnetic lines of force as indicated by arrows of dotted lines in FIG. 3 between the magnetic pole parts 25a and 26a, thereby generating a magnetic field in a space between the object 20 to be processed and the window 18b. In order to generate the magnetic field substantially uniformly in a direction parallel to or along the longitudinal direction of the window 18b, the magnetic field generating unit 23 preferably has substantially the same longitudinal length as the longitudinal length of the window 18b, or preferably has a longitudinal length slightly longer than the longitudinal length of the window 18b.

In the present preferred embodiment, the magnetic field generating unit 23 is provided, however, the present invention is not limited to this. A plurality of magnetic field generating units 23 may be provided along the longitudinal direction of the window 18b, thereby generating a magnetic field substantially uniformly along the longitudinal direction of the window 18b.

In the center in a width direction of the E-plane 16a of the coupling rectangular waveguide 16, a strip-shaped rectangular slit 16b is formed so as to extend in a direction parallel to the axis of the coupling rectangular waveguide 16 and to oppose to the windows 18b of the plasma chamber 18. The slit 16b has substantially the same longitudinal length as that of the window 18b of the plasma chamber 18, and has a width smaller than the width of the window 18b. The coupling rectangular waveguide 16 is fixedly mounted by a predetermined means so that the E-plane 16a thereof is in contact with the side wall 18a of the plasma chamber 18 and the slit 16b is in contact with the center of the window 18b of the plasma chamber 18, namely, the slit 16b is matched with the window 18b and is electromagnetically coupled with the window 18b through the silica glass plate 19. In this case, the silica glass plate 19 operates as means for electromagnetically coupling the slit 16b with the window 18b or for propagating the microwave therethrough.

Within the coupling rectangular waveguide 16, as shown in FIGS. 2 and 3, a pair of strip-shaped rectangular electrically conductive metal plates 27 and 27 is provided so as to oppose to each other and a pair of H planes 16c and 16d oppose to each other, and is provided so as to be inclined from the longitudinal direction of the slit 16b. Each of the metal plates 27 and 27 has a longitudinal length larger than that of the slit 16b, and has a width smaller than that of each of the H-plane 16c and 16d of the rectangular waveguide 16.

Figure 4:
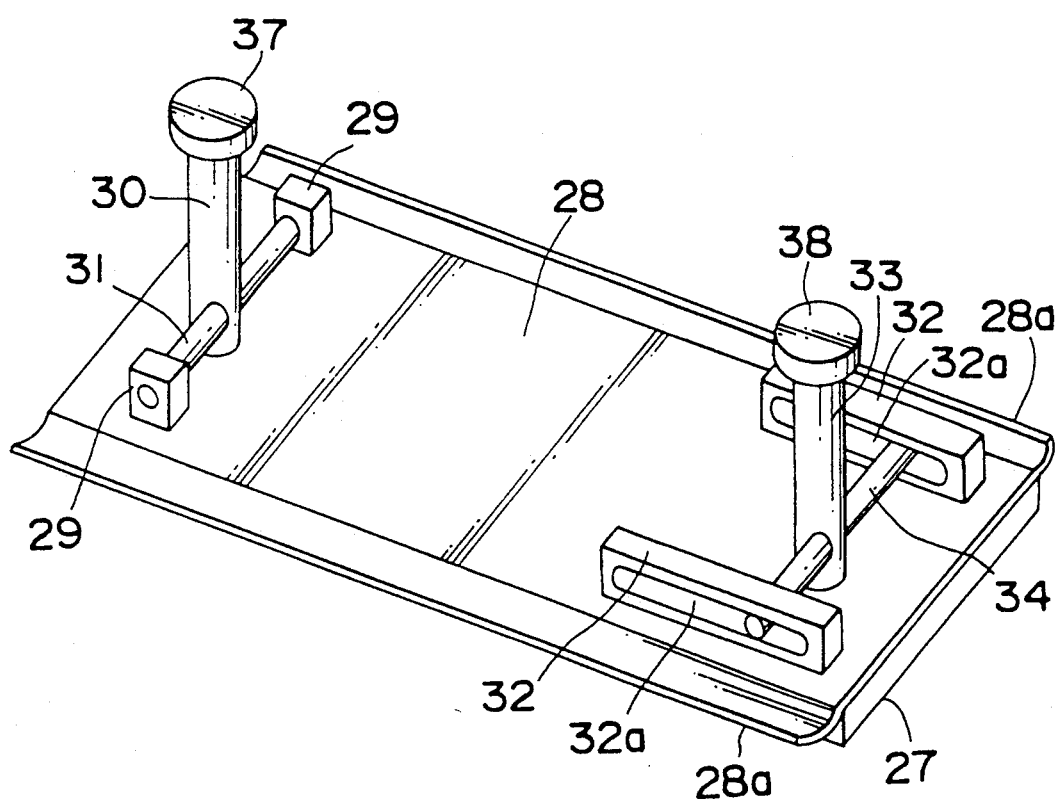
FIG. 4 is a perspective view showing a structure for supporting one of a pair of metal plates of the first preferred embodiment.

As shown in FIG. 4, each of the metal plates 27 and 27 is mounted so as to be in contact with a strip-shaped rectangular supporting plate 28 having substantially the same longitudinal length as that of each metal plate 27, and further each metal plate 27 and the supporting plate 28 are mounted integrally as one body on each other using a bonding agent or the like. Each supporting plate 28 is made of an electrically conductive material, and a pair of deflection or flexible electrical conductors (referred to as flexible conductors hereinafter) 28a and 28a each flexible conductor made of an elastic electrically conductive material is formed having a cross section of a shape of half circular arc, integrally as one body with both ends in the width direction of each supporting plate 28.

A pair of flexible conductors 28a and 28a may be connected with the both ends in the width direction of each supporting plate 28 by a welding method or the like.

At the positions located at one ends of the longitudinal direction on the surface of the supporting plate 28 on the opposite side of the metal plate 27, a pair of supporting metal components 29 and 29 is fixed at an interval in the width direction of the metal plate 27, for example, using a bonding agent or a welding method. Both ends of a rotation shaft 31 fixed at one end of the supporting shaft 30 are rotatably supported by a pair of supporting metal components 29 and 29.

Further, at the positions located at another ends in the longitudinal direction on the surface of the supporting plate 28 on the opposite side of the metal plate 27 on which a pair of supporting metal components 29 and 29 is fixed, a pair of long-strip-shaped supporting metal components 32 and 32 extending in the longitudinal direction of the metal plate 27 is fixed using a bonding agent or a welding method, and further long-strip-shaped long holes 32a and 32a are formed respectively in the supporting metal components 32 and 32. Both ends of a shaft 34 fixed on one end of a supporting shaft 33 are engaged in the long holes 32a and 32a so as to be slidably moved in the longitudinal direction of the supporting plate 28.

As shown in FIG. 3, the above-mentioned pair of metal plates 27 and 27 is provided so that a pair of flexible conductors 28a and 28a formed at the both ends in the width direction of the supporting plates 28 and 28 is elastically in contact onto the inner surfaces of both the E-planes of the rectangular waveguide 16, and then each of the metal plates 27 and 27 is electrically connected through the supporting plate 28 and the flexible conductors 28a and 28a to both the E-planes of the rectangular waveguide 16.

On the outer surfaces of the H-planes 16c and 16d of the coupling rectangular waveguide 16, there are fixed boss members 35 and 36 respectively corresponding to the supporting shafts 30 and 33 attached on the both ends of the respective supporting plates 28 and 28. Each of the supporting shafts 30 is passed through and engaged in a hole of the boss member 35 which is formed so as to pass through the boss member 35 and a hole of each of walls of the H-planes of the rectangular waveguide 16 which is formed so as to pass through each H-plane thereof, so that each of the supporting shafts 30 is slidably moved in a direction parallel to the longitudinal direction of each of the supporting shafts 30. On the other hand, each of the supporting shafts 33 is passed through and engaged in a hole of the boss member 36 which is formed so as to pass through the boss member 36 and a hole of each of walls of the H-planes of the rectangular waveguide 16 which is formed so as to pass through each H-plane thereof, so that each of the supporting shafts 33 is slidably moved in a direction parallel to the longitudinal direction of each of the supporting shafts 33.

On the outer end of each of the supporting shafts 30, a stopper lug 37 is attached through a screw connection means or the like, and a stopper lug 38 is attached through a screw connection means or the like on the outer end of each of the supporting shafts 33. An insertion length of the movement of the supporting shaft 30 into the inner side of the rectangular waveguide 16 is regulated since the lug 37 is in contact to the boss member 35 when moving the supporting shaft 30. On the other hand, an insertion length of the movement of the supporting shaft 3 into the inner side of the rectangular waveguide 16 is regulated since the lug 38 is in contact to the boss member 36 when moving the supporting shaft 33.

Further, a locking screw 39 for locking the movement of the supporting shaft 30 is attached with each of the boss members 35, and a locking screw 40 for locking the movement of the supporting shaft 33 is attached with each of the boss members 36. When tightening the locking screws 39 and 40, the supporting shafts 30 and 33 are fixed at any positions, respectively, in such a range that the supporting shafts 30 and 33 can be slidably moved.

The above-mentioned pair of metal plates 27 and 27 is provided for adjusting the power of the microwave propagating through respective parts of the slit 16b into the plasma chamber 18. Respective inclination angles of the metal plates 27 and 27 from the longitudinal direction of the slit 16b can be adjusted so that the power of the microwave propagating through the slit 16b into the plasma chamber 18 is made substantially uniform along the longitudinal direction of the slit 16b by adjusting the insertion length of each of the supporting shafts 30 and 33 into the rectangular waveguide 16.

In the case of the plasma processing apparatus shown in FIGS. 1 and 2, the ends on the generator side of the respective metal plates 27 are respectively located at positions close to the H-planes 16c and 16d of the rectangular waveguide 16, while the ends on the load side of the respective metal plates 27 are respectively located at positions close to the slit 16b. In this case, as shown in FIG. 2, an opposing gap on the generator side of the rectangular waveguide 16 (referred to as a first gap hereinafter) between a pair of metal plates 27 and 27 and another opposing gap on the load side of the rectangular waveguide 16 (referred to as a second gap hereinafter) between a pair of metal plates 27 and 27 are set so that the first gap is larger than the second gap.

A method of the plasma process using the plasma processing apparatus of the first preferred embodiment will be described hereinafter.

First of all, the object 20 to be processed is provided within the plasma chamber 18, and thereafter, the plasma chamber 18 is made in a predetermined high vacuum state. Then, a predetermined processing gas is supplied through the processing gas introduction pipe 41 into the plasma chamber 18 until the inner air of the plasma chamber 18 becomes a predetermined pressure.

In such a state, a microwave is supplied from the microwave generator 11 through the isolator 12, the directional coupler 13 and the impedance matching unit 14 into one end of the coupling rectangular waveguide 16, and then the microwave inputted within the rectangular waveguide 16 propagates through the slit 16b and the window 18b of the plasma chamber 18 into the plasma chamber 18 as indicated by real lines in FIG. 3. Then, the processing gas flowed into the plasma chamber 18 is made in a strip-shaped plasma state, and then the generated plasma is projected onto the object 20 to be processed, resulting in performing a predetermined plasma process such as a CVD process, an ashing process, a sputtering process, an etching process or the like. The microwave other than that has propagated within the plasma chamber 18 is absorbed by the dummy load 17.

In the present preferred embodiment, since, in particular, a pair of metal plates 27 and 27 is provided within the coupling rectangular waveguide 16, the power of the microwave propagating through the slit 16b into the plasma chamber 18 can be made substantially uniform along the longitudinal direction of the slit 16b by adjusting the inclination angles of the metal plates 27 and 27 from the longitudinal direction of the slit 16b of the coupling rectangular waveguide 16. Therefore, the strip-shaped plasma can be made substantially uniform so that the densities of respective parts of the strip-shaped plasma generated along the longitudinal direction of the window 18b can be uniform, and then the generated plasma can be projected uniformly onto respective parts of the object 20 to be processed. In the present preferred embodiment, there is provided a pair of metal plates 27 and 27, however, the present invention is not limited to this. Either one of metal plates 27 and 27 may be provided.

When a pair of metal plates 27 and 27 is provided within the rectangular waveguide 16 as described above so that the first gap is smaller than the second gap, almost all of the microwave inputted into the coupling rectangular waveguide 16 is divided so as to be in both the outer sides of the metal plates 27 and 27. However, when, as shown in FIGS. 1 and 2, a pair of metal plates 27 and 27 is set so that the ends thereof on the generator side of the coupling rectangular waveguide 16 are positioned so as to be close to the H-planes of the coupling rectangular waveguide 16, namely, the first gap is larger than the second gap, almost all of the inputted microwave can be propagated into a space of the first gap (referred to as a first gap space hereinafter) formed between the ends on the generator side of the metal plates 27 and 27. This results in that almost all of the microwave inputted into the first gap space can be flowed through the slit 16b into the plasma chamber 18.

In the first preferred embodiment, a pair of metal plates 27 and 27 is provided as means for substantially unifying the power of the microwave propagating through the slit 16b into the plasma chamber 18 along the longitudinal direction of the slit 16b. However, the present invention is not limited to this, there may be alternatively provided a further means for substantially unifying the power of the microwave propagating through the slit 16b into the plasma chamber 18 along the longitudinal direction of the slit 16b. For example, the following modifications of the first preferred embodiment may be provided.

Figure 5:
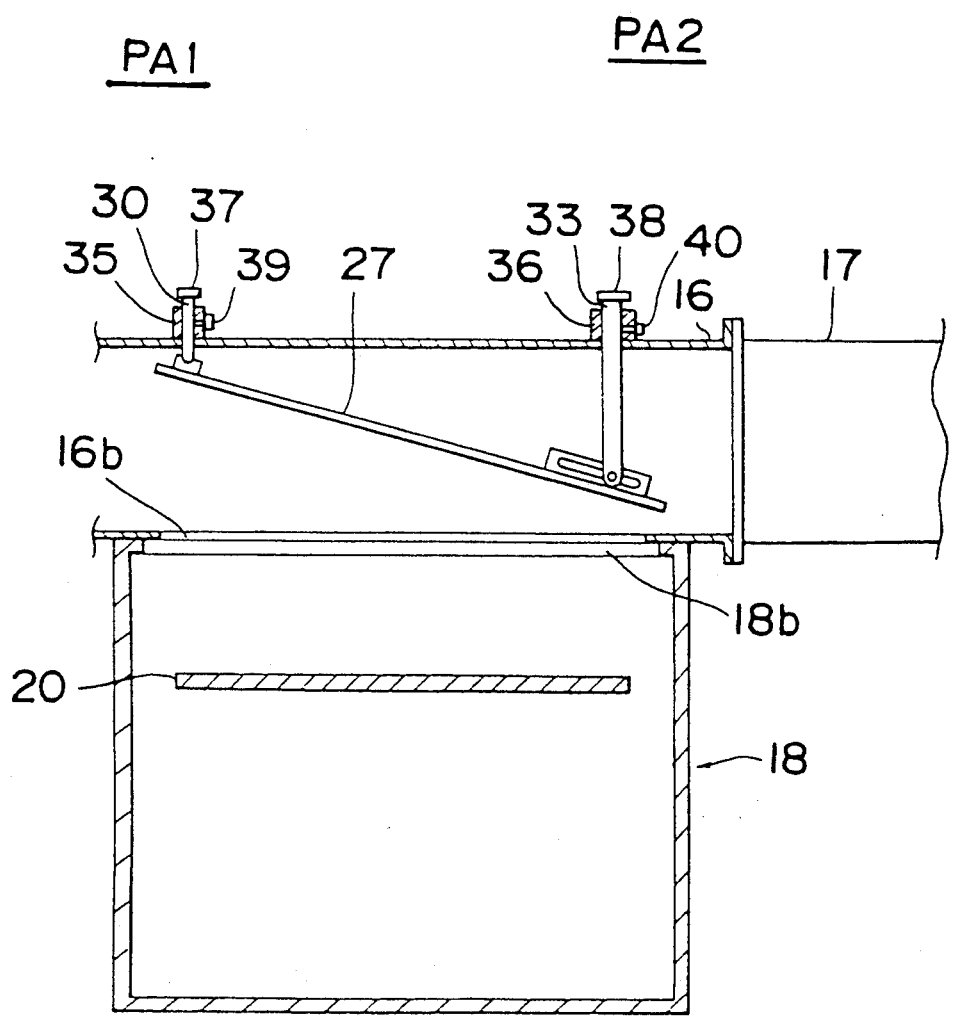
FIG. 5 is a longitudinal cross sectional view of the coupling rectangular waveguide 16 of a modification of the first preferred embodiment for coupling with a plasma chamber 18 and peripheral components thereof shown in FIG. 1.
Figure 6:
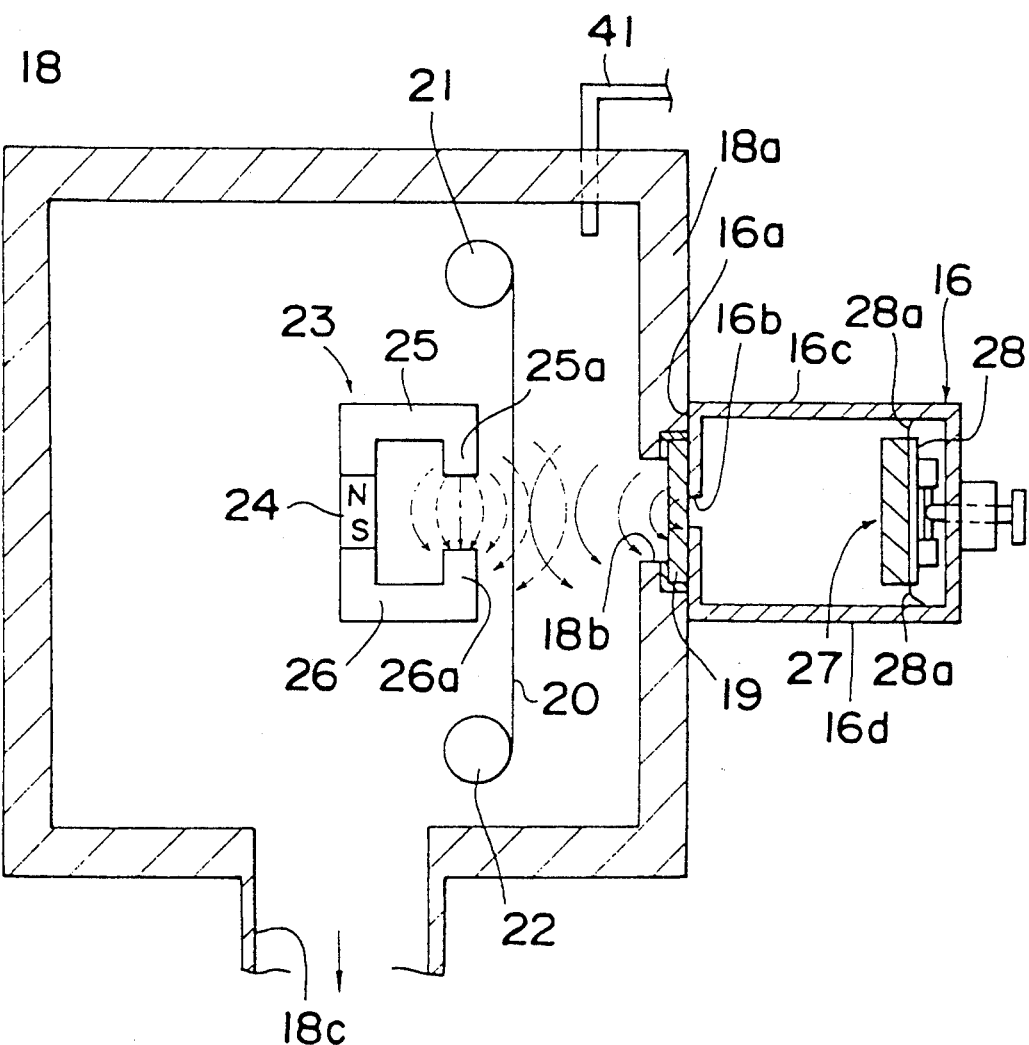
FIG. 6 is an enlarged cross sectional view on line III—III' of FIG. 1 showing the plasma chamber 18 and the coupling rectangular waveguide 16 of the modification shown in FIG. 5.

FIG. 5 shows the coupling rectangular waveguide 16 of a modification of the first preferred embodiment for coupling with a plasma chamber 18 and peripheral components thereof shown in FIG. 1, and FIG. 6 is an enlarged cross sectional view on line III—III' of FIG. 1 showing the plasma chamber 18 and the coupling rectangular waveguide 16 of the modification shown in FIG. 5.

Referring to FIGS. 4 and 5, a metal plate 27 is provided within the coupling rectangular waveguide 16 so as to oppose to the E-plane 16a in such a state that the metal plate 27 is mounted in another E-plane opposing to the E-plane 16a so as to be inclined with a predetermined inclination angle from the longitudinal direction of the I slit 16b of the coupling rectangular waveguide 16, using two sets of position adjustment mechanisms PA1 and PA2 respectively comprising the supporting shafts 30 and 33, the boss members 35 and 36, the stopper lugs 37 and 38, and the locking screws 39 and 40, in a manner similar to that of the first preferred embodiment. Then, the metal plate 27 is electrically connected through the supporting plate 28 and the flexible conductors 28a and 28a to the both the H-planes 16c and 16d of the rectangular waveguide 16. It is noted that the metal plate 27 and these mounting members for mounting the metal plate 27 therein are made of the same materials as those of the above-mentioned first preferred embodiment.

Figure 7:
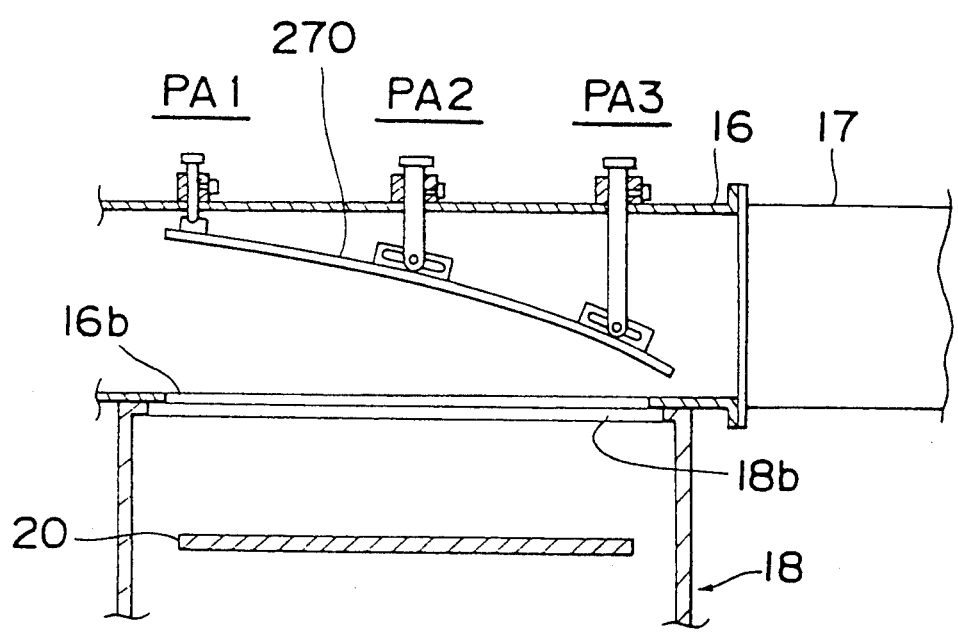
FIG. 7 is a longitudinal cross sectional view of the coupling rectangular waveguide 16 of another modification of the first preferred embodiment for coupling with a plasma chamber 18 and peripheral components thereof shown in FIG. 1.

The cross section in the longitudinal direction of each of the metal plates 27 may be curved. For example, as shown in FIG. 7, a flexible metal plate 270 may be used in stead of the metal plate 27. In this case, the flexible metal plate 270 is mounted in the coupling rectangular waveguide 16 through at least three sets of position adjustment mechanisms PA1 to PA3 so that the cross section in the longitudinal direction of the metal plates 270 is curved with any curve shape. Then, the distribution of the plasma can be adjusted in various kinds of manners.

In the above-mentioned preferred embodiment, since a strip-shaped plasma is generated along the longitudinal direction of the window 18b of the plasma chamber 18, the generated plasma can be projected onto parts of almost all of the width of the object 20 having a relatively large area to be processed. Further, since the object 20 to be processed is moved in a direction perpendicular to the longitudinal direction or the shorter axis direction of the slit 16b so as to be wound up by the wound-up roller 22, the plasma process can be performed continuously for the object 20 to be processed.

In the present preferred embodiment, the object 20 to be processed has a shape of sheet, however, the present invention is not limited to this.

Further, in particular, in the present preferred embodiment, since the magnetic field is generated between the object 20 to be processed and the window 18b by the magnetic field generating unit 23, charged particles of the generated plasma receive a force caused due to the magnetic field and then move in a shape of spiral or screw. This results in accelerating ionization of the processing gas, and then heightening the density of the plasma which is projected onto the object 20 to be processed.

Furthermore, when the intensity of the magnetic field generated by the magnetic field generating unit 23 is adjusted so that the ECR phenomenon is caused in a space between the object 20 to be processed and the window 18b, the density of the plasma can be remarkably heightened.

SECOND PREFERRED EMBODIMENT

Figure 8:
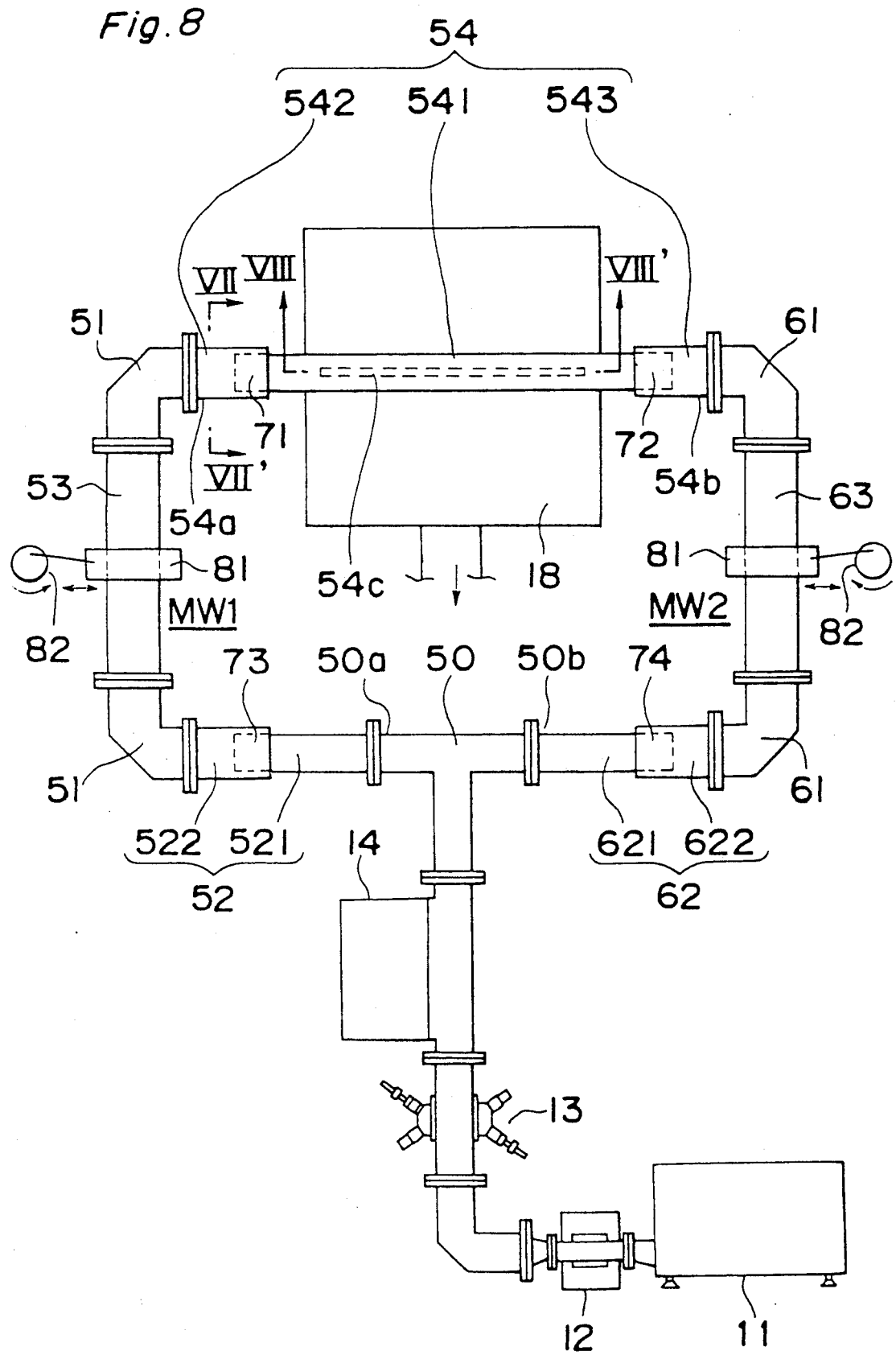
FIG. 8 is a top plan view showing the whole composition of a plasma processing apparatus of a second preferred embodiment according to the present invention.

FIG. 8 shows the whole composition of a plasma processing apparatus of a second preferred embodiment according to the present invention. In FIG. 8, the same components as those shown in FIG. 1 are designated by the same numerals as those shown in FIG. 1.

Referring to FIG. 8, the microwave generator 11 is connected in series through the isolator 12, the directional coupler 13 and the impedance matching unit 14 to a branch T type rectangular waveguide 50. Further, one branch end 50a of the branch T type rectangular waveguide 50 is connected in series through corner rectangular waveguides 51 and 51 and rectangular waveguides 52 and 53 to one end 54a of a coupling rectangular waveguide 54 for electromagnetically coupling with the plasma chamber 18. On the other hand, another branch end 50b of the branch T type rectangular waveguide 50 is similarly connected in series through corner rectangular waveguides 61 and 61 and rectangular waveguides 62 and 63 to another end 54b of the coupling rectangular waveguide 54.

The coupling rectangular waveguide 54 having a slit 54c formed in a manner similar to that of the slit 16b of the first preferred embodiment is fixed so that the slit 54c is in contact with and extends along the center of a rectangular-shaped window (not shown) like a long strip formed in the plasma chamber 18. In the plasma chamber 18, there are provided in a manner similar to that of the first preferred embodiment, the exhaust port 18c, the processing gas introduction pipe 41, the object 20 to be processed, a pair of rollers 21 and 22, and the magnetic field generating unit 23. The description of these components is omitted therein.

In both ends of the coupling rectangular waveguide 54 and the rectangular waveguides 52 and 62, movable connection sections 71, 72, 73 and 74 are mounted so as to be moved in a direction of the axis of each of the rectangular waveguides 54, 52 and 62, and a pair of rectangular waveguides of each of the movable connection sections 71 to 74 are engaged in each other so as to be slidably moved as shown in FIG. 9 in each of the movable connection sections.

For example, as shown in FIG. 9, the movable connection section 71 located at the one end of the coupling rectangular waveguide 54 comprises an inner fixed rectangular waveguide 541 and an outer movable rectangular waveguide 542 which are engaged in each other so that one end of the inner rectangular waveguide 541 is inserted into one end of the outer rectangular waveguide 542. Referring to FIGS. 9 and 10, in the movable connection section 71, half-circular-arc-shaped flexible electrical conductors 541a, 541a, 541b and 541b are integrally formed as one body in all the peripheries or all the sides of the end of the inner fixed rectangular waveguide 541, and are mounted so as to be in elastic contact with both the inner E-planes 542e and 542e and both the inner H-planes 542h and 542h of the outer movable rectangular waveguide 542. Then, the inner and outer rectangular waveguides 541 and 542 of the movable connection section 71 are electrically connected to each other through the respective E-planes and the respective H-planes thereof. In a manner similar to that of the movable connection section 71, as shown in FIG. 8, (a) the movable connection section 72 comprises an inner fixed rectangular waveguide 541 and an outer movable rectangular waveguide 543 which are electrically connected to each other through flexible electrical conductors;

(b) the movable connection section 73 comprises an inner fixed rectangular waveguide 521 and an outer movable rectangular waveguide 522 which are electrically connected to each other through flexible electrical conductors; and (c) the movable connection section 74 comprises an inner fixed rectangular waveguide 621 and an outer movable rectangular waveguide 622 which are electrically connected to each other through flexible electrical conductors.

In the plasma processing apparatus of the second preferred embodiment constituted as described above, (a) a movable waveguide section MW1 comprising the corner rectangular waveguides 51 and 51, the rectangular waveguide 53 and the movable rectangular waveguides 522 and 542 and (b) another movable waveguide section MW2 comprising the corner rectangular waveguides 61 and 61, the rectangular waveguide 63 and the movable rectangular waveguides 543 and 622 are moved forward or backward in a direction of the axis of the rectangular waveguides 52, 62 and 54, the length of the waveguide path can be changed. That is, the phase of the standing wave generated in the longitudinal direction of the slit 54c within the coupling rectangular waveguide 54 can be adjusted to be set to any value.

It is necessary to move both the movable waveguide sections MW1 and MW2 by the same movement length as each other in the same direction parallel to the direction of the axis of the rectangular waveguides 52, 62 and 54. After adjusting the movement length of the waveguide sections MW1 and MW2, the waveguide sections MW1 and MW2 are fixed by a predetermined means.

Further, drivers 82 and 82 for driving crank mechanisms respectively connected to supporting components 81 and 81 which are mounted on the rectangular waveguides 53 and 63 of the movable waveguide sections MW1 and MW2 are moved so as to interlock with a coordinated operation in synchronous with each other, and then the above-mentioned movement length can be continuously changed forward or backward with respect to a reference position as the time passes.

In the case of performing a plasma process using the plasma processing apparatus of the second preferred embodiment, a predetermined processing gas is supplied into the plasma chamber 18 until the inner air of the plasma chamber 18 becomes a predetermined pressure. Thereafter, when a microwave generated by the microwave generator 11 is supplied through both the branch ends 50a and 50b of the branch T type rectangular waveguide 50 and both the ends 54a and 54b of the coupling rectangular waveguide 54 into the coupling rectangular waveguide 54, a standing wave is generated within the coupling rectangular waveguide 54 as indicated by a real line W1 shown in FIG. 11 due to an interference between the microwaves supplied from both the directions or both the ends 54a and 54b of the coupling rectangular waveguide 54, and then the microwave propagate through the slit 54c into the plasma chamber 18. In this case, the density of the strip-shaped plasma generated between the slit 54c and the object 20 to be processed becomes ununiform in the direction of the axis of the coupling rectangular waveguide 54, depending on the waveform of the generated standing wave. However, since the degree of the ununiformity thereof is made less in such a process that the plasma to be projected onto the object 20 to be processed is diffused, and then the generated plasma can be projected onto the object 20 substantially uniformly, thereby performing a predetermined plasma process more efficiently at a high speed.

In particular, in the second preferred embodiment, since the movable connection section 71, 72, 73 and 74 provided between the microwave generator 11 and the plasma chamber 18 are moved so as to change the phase of the standing wave, for example, to set it to various kinds of the standing waves W2, W3, . . . as indicated by dotted lines shown in FIG. 11, the generated plasma can be projected more uniformly onto the object 20 having any width to be processed.

Further, when these movable connection sections 1 to 74 are moved to interlock forward or backward from a reference position in synchronous with each other in the direction of the axis of the rectangular waveguides thereof, the phase of the standing wave is shifted in a direction of the longitudinal direction of the slit 54c, and then for example, there are generated various kinds of standing waves W1, W2, W3, W2, W1, W2, . . . . . This results in that the time-average density of the plasma in the width direction of the object 20 to be processed can be made uniform, and then the generated plasma can be projected onto respective parts of the object 20 to be processed more uniformly.

OTHER PREFERRED EMBODIMENTS

In the present preferred embodiments, there is provided the magnetic field generating unit 23 for generating the magnetic field in a space between the object 20 to be processed and the window 18b, however, the present invention is not limited to this. The following magnetic field generating units 23a and 23b may be used.

Figure 12:
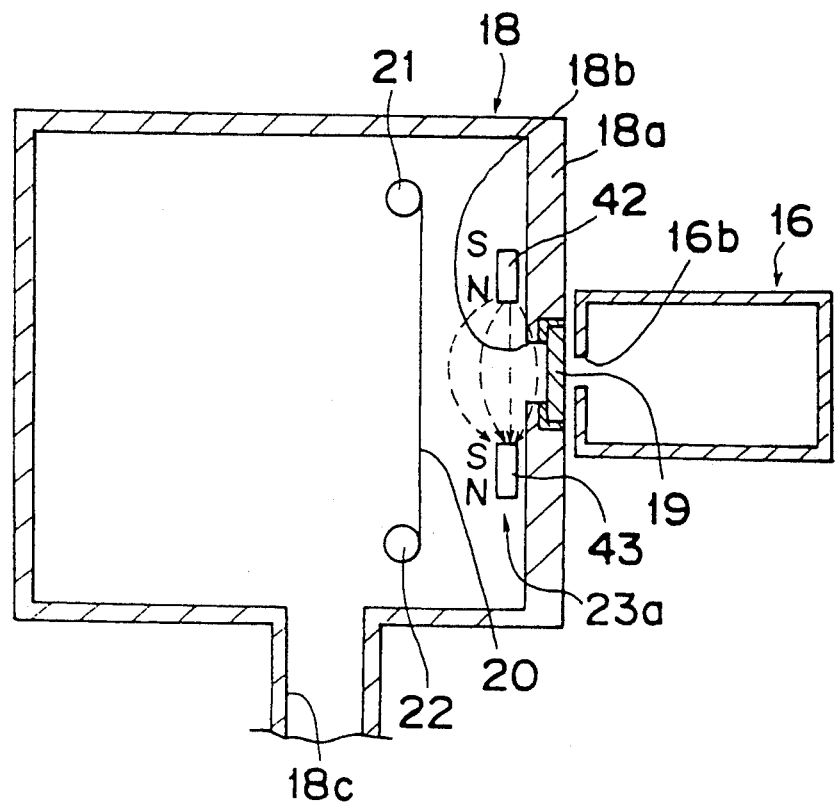
FIG. 12 is a cross sectional view of a magnetic field generating unit 23a of a first modification of the preferred embodiments.

FIG. 12 shows the magnetic field generating unit 23a of a first modification which is applied to the first preferred embodiment.

Referring to FIG. 12, the magnetic field generating unit 23a comprises a pair of permanent magnets 42 and 43 are located on both sides of the shorter axis of the window 18b within the plasma chamber 18 so that the N pole of the magnet 42 and the S pole of the magnet 43 oppose to each other. Then, there are generated magnetic lines of force from the N pole of the magnet 42 to the S pole of the magnet 43 in a space between the object 20 to be processed and the window 18b. In this case, each of the magnets 42 and 43 preferably has substantially the same longitudinal length as the length of the longer axis of the window 18b, or preferably has a longitudinal length slightly longer than that of the window 18b.

In this case, the substantially uniform magnetic field can be generated along the longitudinal direction of the window 18b.

Further, a plurality of pairs of magnets 42 and 43 may be provided at an interval in the longitudinal direction of the window 18b.

Figure 13:
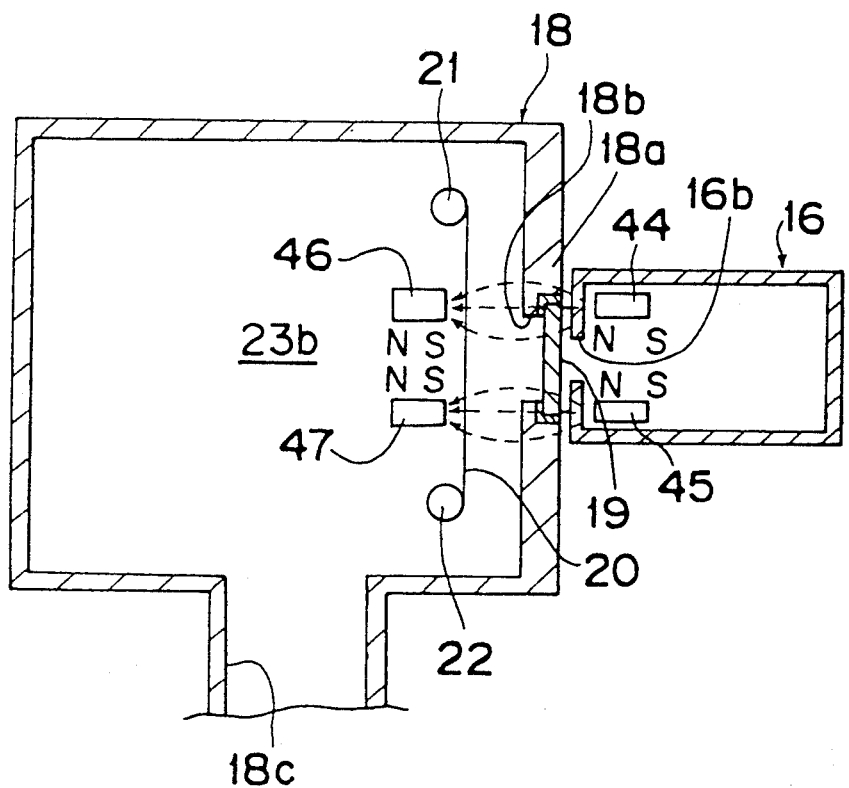
FIG. 13 is a cross sectional view of another magnetic field generating unit 23b of a second modification of the preferred embodiments.

FIG. 13 shows another magnetic field generating unit 23b of a second modification which is applied to the first preferred embodiment.

Referring to FIG. 13, the magnetic field generating unit 23b comprises a pair of permanent magnets 44 and 45 which is provided within the coupling rectangular waveguide 16 so as to be located on both side of the slit 16b, a pair of permanent magnets 46 and 47 which is provided at a space on the opposite side surface of the object 20 within the plasma chamber 18 so as to respectively oppose to a pair of magnets 44 and 45. In this case, both the magnets 44 and 45 are magnetized in the same magnetizing direction, and both the magnets 46 and 47 are magnetized in the same directions as that of the magnets 44 and 45. Then, there are generated magnetic lines in directions from the N pole of the magnet 44 toward the S pole of the magnet 46, and from the N pole of the magnet 45 toward the S pole of the magnet 47.

In this case, each of the magnets 44 to 47 preferably has substantially the same longitudinal length as the length in the longer axis direction of each of the slit 16b and the window 18b, or preferably has a longitudinal length larger than that of each of the slit 16b and the window 18b.

In this case, the substantially more uniform magnetic field can be generated along the longitudinal direction of the window 18b.

Further, a plurality of sets of a pair of magnets 44 and 45 and a pair of magnets 46 and 47 may be provided at an interval in the longitudinal direction of the window 18b.

In the above-mentioned preferred embodiments and the modifications thereof, each of the magnetic field generating units 23, 23a and 23b is positioned so that the microwave propagates through the window 18b into the plasma chamber 18 and from an area having a weak magnetic field toward another area having a strong magnetic field. However, each of the magnetic field generating units 23, 23a and 23b is preferably positioned so that the microwave propagates from an area having a strong magnetic field toward another area having a weak magnetic field.

There may be separately provided another divergent magnetic field generating unit for generating a divergent magnetic field so that the generated magnetic field is generated toward the plasma chamber 18 in the center in the width direction of the window 18b of the plasma chamber 18. In the case where another divergent magnetic field generating unit is separately provided, the plasma can be further projected onto the object 20 to be processed.

Figure 14:
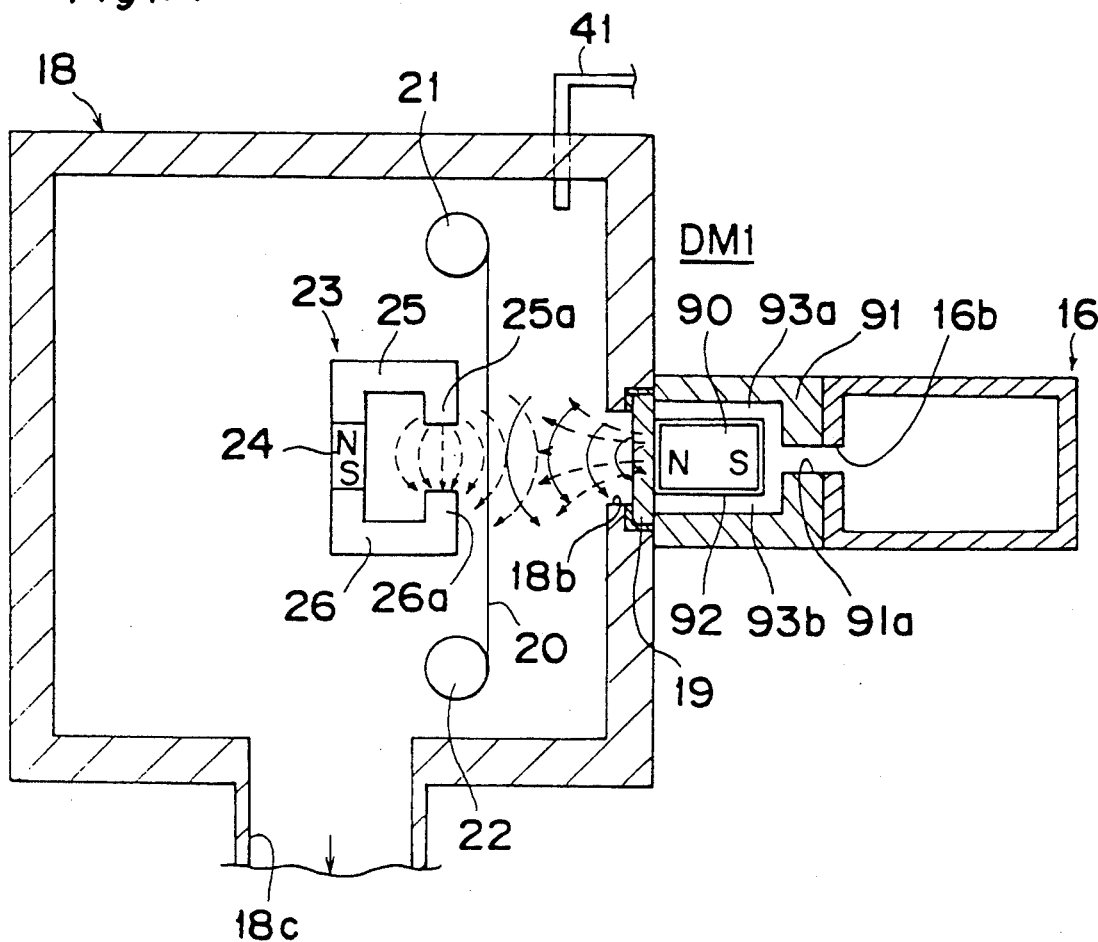
FIG. 14 is a cross sectional view of a divergent magnetic field generating unit DM1 provided in the magnetic field generating unit 23 of a first modification of the preferred embodiments.

FIG. 14 is a cross sectional view of a divergent magnetic field generating unit DM1 of this type provided in the magnetic field generating unit 23 of a first modification which is applied to the first preferred embodiment.

Referring to FIG. 14, the divergent magnetic field generating unit DM1 is provided between the rectangular waveguide 16 and the plasma chamber 18, wherein the divergent magnetic field generating unit DM1 comprises a permanent magnet 90 provided as a divergent magnetic field generating unit, and a rectangular-cylinder-shaped electrically conductive container 91 of Al, Cu or a stainless for forming a waveguide path for propagating the microwave around the outer peripheral surface of the permanent magnet 90. In the center in the width direction on the waveguide 16 side of the container 91, a slit 91a having the same dimensions as those of the slit 16b is formed so as to extend in the direction of the axis of the coupling rectangular waveguide 16, and is further positioned so that both the slits 16b and 91a oppose to each other in parallel to each other, whereby both the slits 16b and 91a make a waveguide path for passing microwave therethrough. Further, the container 91 is fixed and mounted between the plasma chamber 18 and the coupling rectangular waveguide 16 by a predetermined means.

The permanent magnet 90 is positioned so that the center axis of the N and S poles thereof coincide with the center in the width direction of the window 18b of the plasma chamber 18, and for example, the N pole thereof is located on the side of the plasma chamber 18 and confronts the plasma chamber 18 through the center in the width direction of the window 18b, thereby generating a divergent magnetic field in a direction from the center in the width direction of the window 18b toward the plasma chamber 18 as indicated by dotted lines. Further, the whole surface in the longitudinal direction of the permanent magnet 90 is covered with an electrically conductive thin plate 92. The permanent magnet 90 is fixedly mounted within the container 91 so as to form waveguide paths 93a and 93b each made of a longitudinal space having the same longitudinal length as the longitudinal length of the slit 91a, over a space from the slit 91a toward the plasma chamber 18. Then, the container 91 is fixed and mounted between the plasma chamber 18 and the coupling rectangular waveguide 16 as described above.

Ends on the plasma chamber 18 side of the two waveguide paths 93a and 93b are in contact onto the outer surface of the silica glass plate 19. Therefore, the microwave propagated within the coupling rectangular waveguide 16 passes through the slits 16b and 91a and the two waveguides 93a and 93b into the plasma chamber 18, namely, the microwave propagates from the window 18b into the plasma chamber 18, i.e., from an area having a strong magnetic field toward another area having a weak magnetic field as indicated by real lines in FIG. 14.

Figure 15:
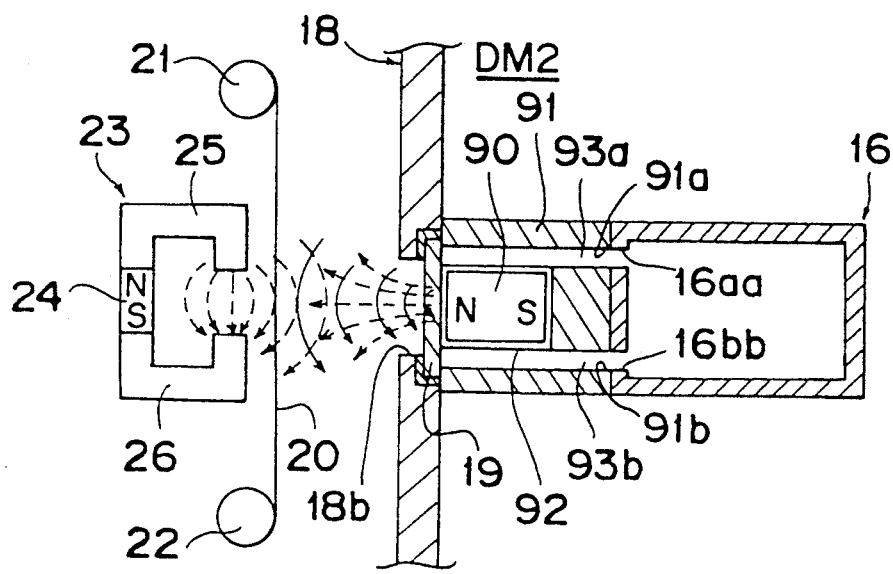
FIG. 15 is a cross sectional view of a divergent magnetic field generating unit DM2 provided in the magnetic field generating unit 23 of a second modification of the preferred embodiments.

FIG. 15 shows a divergent magnetic field generating unit DM2 provided in the magnetic field generating unit 23 of a second modification which is applied to the first preferred embodiment.

As shown in FIG. 15, there may be further provided two slits 16aa and 16bb and the slits 91a and 91b, corresponding to the above-mentioned two waveguide paths 93a and 93b, these slits propagate the microwave inputted into the coupling rectangular waveguide 16 into the two waveguides 93a and 93b.

Figure 16:
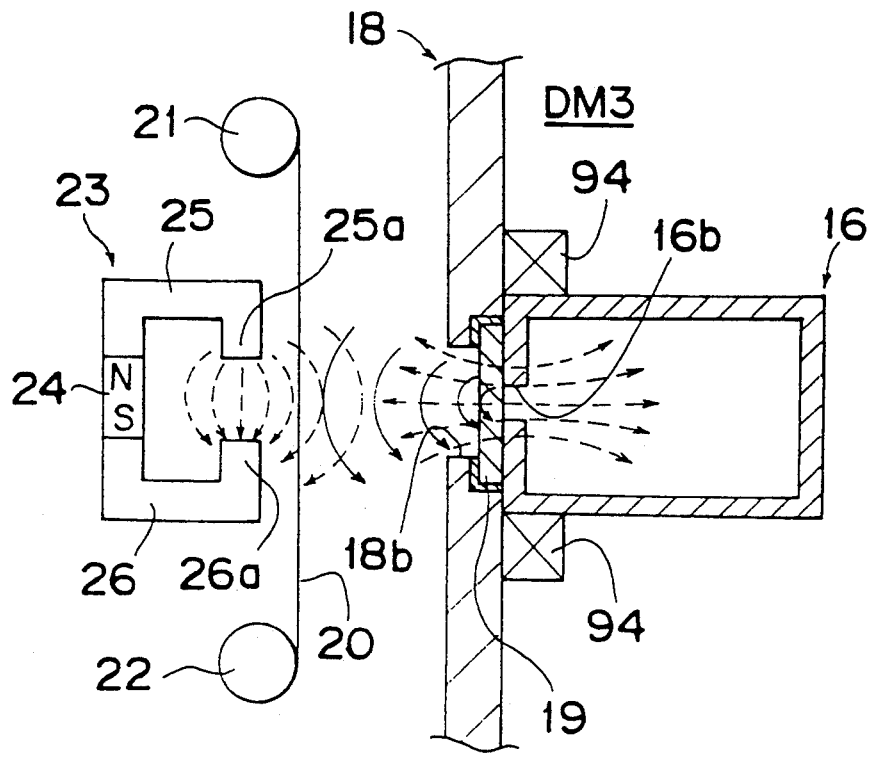
FIG. 16 is a cross sectional view of a divergent magnetic field generating unit DM3 provided in the magnetic field generating unit 23 of a third modification of the preferred embodiments.

FIG. 16 shows a divergent magnetic field generating unit DM3 provided in the magnetic field generating unit 23 of a third modification which is applied to the first preferred embodiment.

As shown in FIG. 16, as the divergent magnetic field generating unit DM3, there may be provided an electromagnet 94 on the outer periphery of the coupling rectangular waveguide 16 so as to be close to the slit 16b of the rectangular waveguide 16. The electromagnet 94 generates a divergent magnetic field as indicated by dotted lines in FIG. 16.

Figure 17:
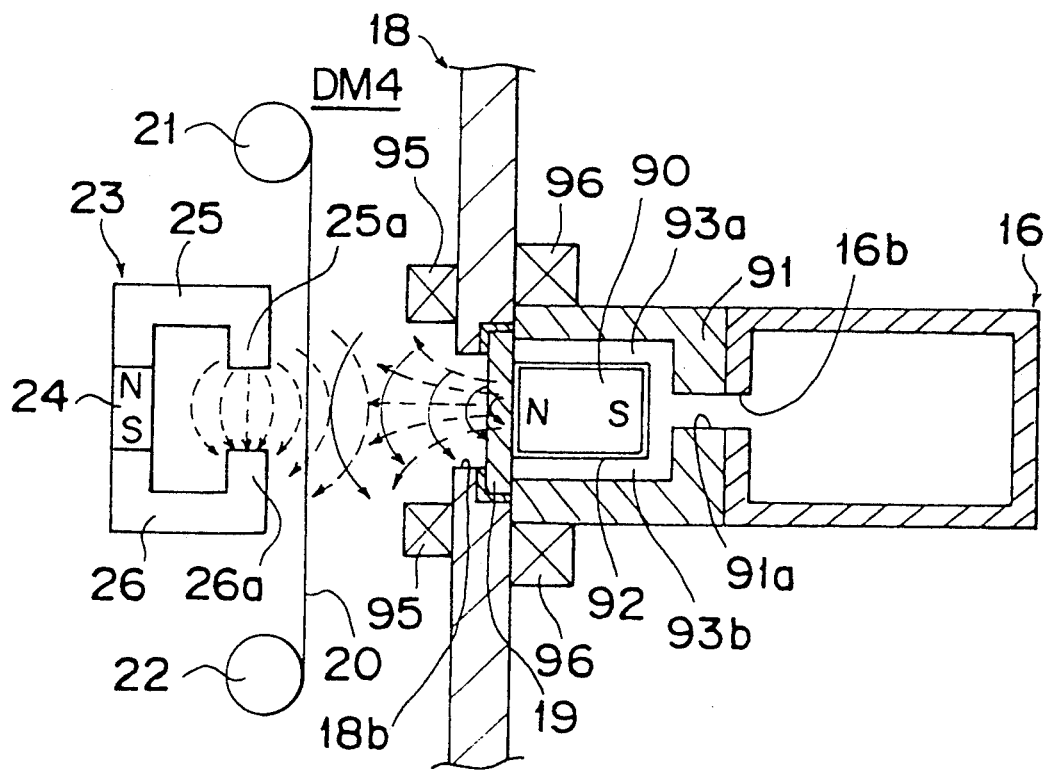
FIG. 17 is a cross sectional view of a divergent magnetic field generating unit DM4 provided in the magnetic field generating unit 23 of a fourth modification of the preferred embodiments.
Figure 18:
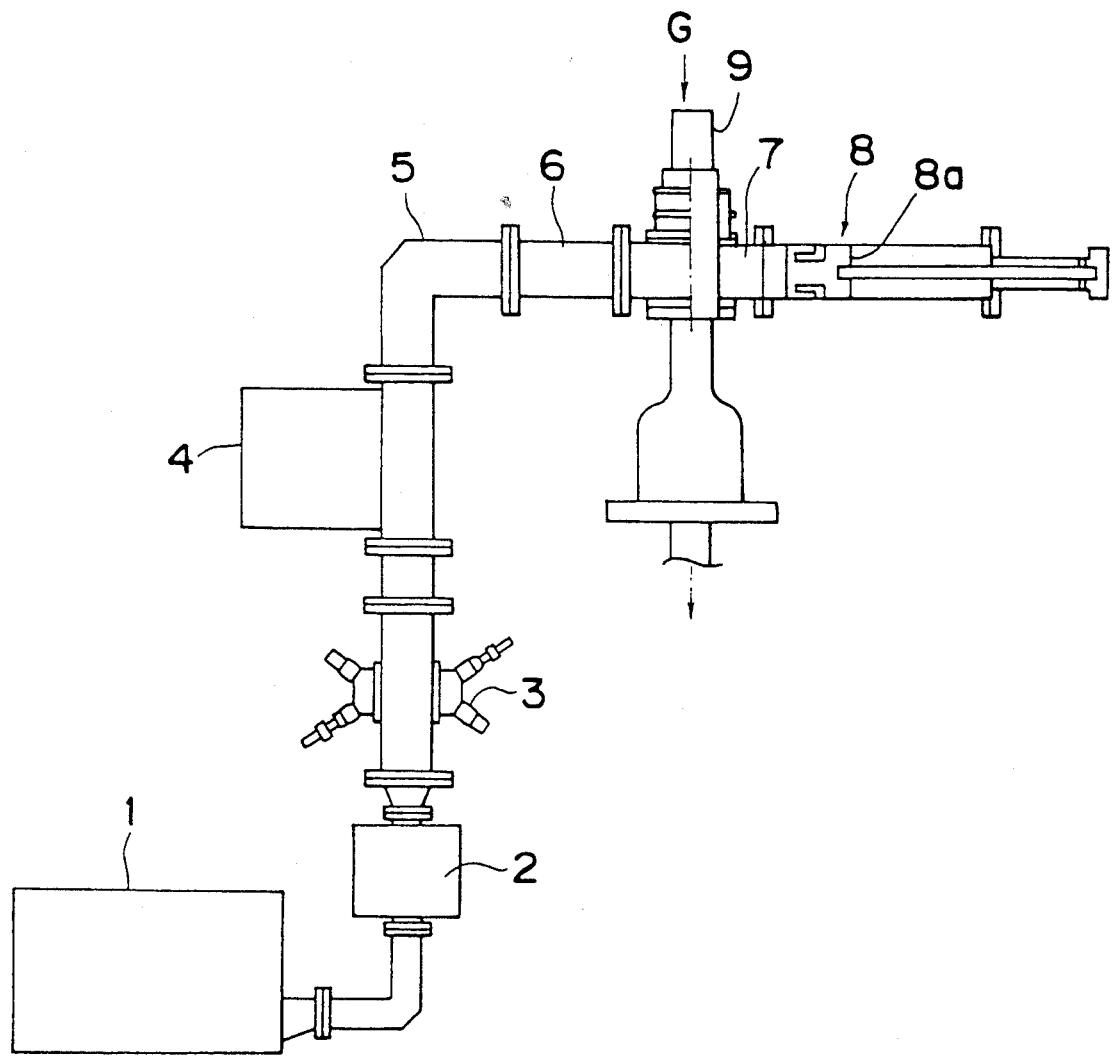
FIG. 18 is a top plan view showing the whole composition of a conventional plasma processing apparatus.

FIG. 17 shows a divergent magnetic field generating unit DM4 provided in the magnetic field generating unit 23 of a fourth modification which is applied to the first preferred embodiment.

As shown in FIG. 17, in addition to the above-mentioned permanent magnet 90 operating as the divergent magnetic field generating means DM1, there may be further provided the divergent magnetic field generating means DM4 comprising electromagnets 95 and 96, wherein the electromagnet 95 is mounted within the plasma chamber 18 so as to be close to the window 18b, and the electromagnet 96 is mounted on the outer peripheral surface of the container 91 so as to be close to the plasma chamber 18. In this case, the shape of the divergent magnetic field can be controlled by changing the current flowing into the electromagnets 95 and 96.

Further, there may be provided either one of the electromagnets 95 and 96, or there may be provided both of the electromagnets 95 and 96.

In the above-mentioned preferred embodiments and the modifications thereof, the divergent magnetic field generating unit is used together with the above-mentioned magnetic field generating unit. However, the present invention is not limited to this. If there is obtained a predetermined desirable intensity of the magnetic field, there may be used only the divergent magnetic field generating unit without using the magnetic field generating unit.

In the above-mentioned preferred embodiments and the modifications thereof, each of the above-mentioned magnetic field generating units 23, 23a and 23b comprises a permanent magnet or permanent magnets. However, the present invention is not limited to this. There may be used an electromagnet or electromagnets instead of the permanent magnet or magnets. In particular, in the case of providing the permanent magnet or magnets within the plasma chamber 18, generally speaking, the intensity of the magnetic field is lowered due to heat. However, in the case of providing the electromagnet or electromagnets within the plasma chamber 18, the intensity of the magnetic field can be prevented from being lowered due to heat.

In the first preferred embodiment, the silica glass plate 19 is attached and mounted in an airtight state in the window 18b of the plasma chamber 18, and then the coupling part between the slit 16b of the coupling rectangular waveguide 16 and the window 18b of the plasma chamber 18 is made in an airtight state, however, the present invention is not limited to this. For example, the silica glass plate 19 may be mounted on the coupling rectangular waveguide 16 so as to close the slit 16b with the silica glass plate 19, and the E-plane 16a of the coupling rectangular waveguide 16 on which the slit 16b is formed may be connected in an airtight state onto the side wall 18a of the plasma chamber 18 in which the window 18b is formed. In the case where the silica glass plate 19 is mounted so as to be adjacent to the inner wall of the plasma chamber 18, and then the generated plasma is not flowed into the propagation path of the microwave, resulting in preventing the propagation of the microwave from being interrupted. Therefore, the microwave can be inputted into the plasma chamber 18 more efficiently.

Furthermore, in stead of the silica glass plate 19, there may be a plate of the other material capable of propagating a microwave, in other words, which does not absorb the microwave.

According to the preferred embodiments of the present invention, there can be obtained the following advantageous effects.

(1) According to the preferred embodiments of the present invention, the slit 16b is formed in the E-plane of the coupling rectangular waveguide 16 and is connected onto the window 18b of the plasma chamber 18. Therefore, the microwave is propagated through the window 18b into the plasma window 18b, resulting in generation of a strip-shaped plasma along the longitudinal direction of the window 18b. In this case, the plasma can be projected over substantially all the length of a rectangular processing surface of the object 20 to be processed having a relatively large area, thereby performing the plasma process more efficiently.

(2) According to the first preferred embodiment of the present invention, the power of the microwave propagating from one end of the coupling rectangular waveguide 16 through the slit 16b within the plasma chamber 18 can be made substantially uniform along the longitudinal direction of the slit 16b, and then the densities of the respective parts of the generated strip-shaped plasma can be made substantially uniform.

(3) According to the second preferred embodiment of the present invention, the power of the microwave propagating from both ends of the coupling rectangular waveguide 54 through the slit 54c within the plasma chamber 18 can be made substantially uniform along the longitudinal direction of the slit 54c, and then the densities of the respective parts of the generated strip-shaped plasma can be made substantially uniform, resulting in improving the efficiency in supplying the power of the microwave into the plasma chamber 18.

(4) According to the second preferred embodiment of the present invention, the phase of the standing wave generated within the coupling rectangular waveguide 54 is continuously shifted forward or backward. In this case, the time-average density of the plasma in the width direction of the object 20 to be processed can be made uniform, resulting in improving the efficiency in supplying the power of the microwave into the plasma chamber 18.

(5) According to the preferred embodiments of the present invention, the magnetic field is generated in a space or on a microwave propagation path between the object 20 to be processed and the window 18b. Therefore, the density of the generated plasma projected onto the object 20 to be processed can be heightened, and the efficiency in processing the object 20 in the plasma process can be heightened.

(6) According to the preferred embodiments of the present invention, since there is provided each of the divergent magnetic field generating unit DM1, DM2, DM3 and DM4, the density of the plasma can be remarkably heightened.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus comprising:
   a plasma chamber having a strip-shaped rectangular window having a longitudinal length formed in a side wall of said plasma chamber, within which an object to be processed is provided so as to be close to said window;
   a coupling rectangular waveguide having a strip-shaped rectangular slit formed in an E-plane thereof so as to extend in a direction of an axis thereof, said coupling rectangular waveguide being provided so that the direction of the axis of said coupling rectangular waveguide is parallel to the longitudinal direction of said window of said plasma chamber;
   a coupling member, mounted between said slit of said coupling rectangular waveguide and said window of said plasma chamber, for electromagnetically coupling said slit with said window in an airtight state, said coupling member being made of a material for propagating a microwave; and
   microwave generating means, connected to said coupling rectangular waveguide, for generating and supplying a microwave into said coupling rectangular waveguide, thereby propagating the microwave through said slit of said coupling rectangular waveguide, said coupling member and said window of said plasma chamber into said plasma chamber.

2. The apparatus as claimed in claim 1, further comprising microwave unifying means for substantially unifying the microwave propagating through said slit of said coupling rectangular waveguide along the longitudinal direction of said slit.

3. The apparatus as claimed in claim 1, further comprising a branch type rectangular waveguide, mounted between said microwave generating means and a one end of said coupling rectangular waveguide and between said microwave generating means and another end of said coupling rectangular waveguide, said pair of branch type rectangular waveguide propagating the microwave from said microwave generating means into both ends of said coupling rectangular waveguide.

4. The apparatus as claimed in claim 1, further comprising magnetic field generating means for generating a magnetic field on a propagation path between said window of said plasma chamber and said object to be processed on which the microwave propagates through said window of said plasma chamber into said plasma chamber.

5. The apparatus as claimed in claim 2,
   wherein said microwave unifying means comprises a pair of metal plates provided within said coupling rectangular waveguide so as to oppose to each other in parallel to a direction in which both H-planes of said coupling rectangular waveguide oppose to each other, and so as to be inclined from the longitudinal direction of said slit, and
   inclination angles of said pair of metal plates from the longitudinal direction of said slit are set so as to substantially unify the microwave propagating through said slit of said coupling rectangular waveguide along the longitudinal direction of said slit.

6. The apparatus as claimed in claim 2, wherein said microwave unifying means comprises a metal plate provided within said coupling rectangular waveguide in parallel to a direction in which both H-planes of said coupling rectangular waveguide oppose to each other, and so as to be inclined from the longitudinal direction of said slit, and an inclination angle of said metal plate from the longitudinal direction of said slit is set so as to substantially unify the microwave propagating through said slit of said coupling rectangular waveguide along the longitudinal direction of said slit.

7. The apparatus as claimed in claim 2, wherein said microwave unifying means comprises a metal plate provided within said coupling rectangular waveguide in parallel to a direction in which both E-planes of said coupling rectangular waveguide oppose to each other, and so as to be inclined from the longitudinal direction of said slit, and an inclination angle of said metal plate from the longitudinal direction of said slit is set so as to substantially unify the microwave propagating through said slit of said coupling rectangular waveguide along the longitudinal direction of said slit.

8. The apparatus as claimed in claim 2, further comprising a branch type rectangular waveguide, mounted between said microwave generating means and ne end of said coupling rectangular waveguide and between said microwave generating means and another end of said coupling rectangular waveguide, said branch type rectangular waveguide propagating the microwave from said microwave generating means into both ends of said coupling rectangular waveguide.

9. The apparatus as claimed in claim 2, further comprising magnetic field generating means for generating a magnetic field on a propagation path between said window of said plasma chamber and said object to be processed on which the microwave propagates through said window of said plasma chamber into said plasma chamber.

10. The apparatus as claimed in claim 3, further comprising a pair of movable connecting means movably mounted respectively between said branch type rectangular waveguide and one end of said coupling rectangular waveguide and between said branch type rectangular waveguide and another end of said coupling rectangular waveguide, so as to change a length of a waveguide path between said branch type rectangular waveguide and one end of said coupling rectangular waveguide and a length of another waveguide path between said branch type rectangular waveguide and another end of said coupling rectangular waveguide, thereby a phase of a standing wave generated in said coupling rectangular waveguide when the microwave propagates in said coupling rectangular waveguide.

11. The apparatus as claimed in claim 3, further comprising magnetic field generating means for generating a magnetic field on a propagation path between said window of said plasma chamber and said object to be processed on which the microwave propagates through said window of said plasma chamber into said plasma chamber.

12. The apparatus as claimed in claim 4, further comprising divergent magnetic field generating means for generating a divergent magnetic field directing from the center of said window of said plasma chamber toward said plasma chamber.

13. The apparatus as claimed in claim 5, further comprising a branch type rectangular waveguide, mounted between said microwave generating means and one end of said coupling rectangular waveguide and between said microwave generating means and another end of said coupling rectangular waveguide, said branch type rectangular waveguide propagating the microwave from said microwave generating means into both ends of said coupling rectangular waveguide.

14. The apparatus as claimed in claim 5, further comprising magnetic field generating means for generating a magnetic field on a propagation path between said window of said plasma chamber and said object to be processed on which the microwave propagates through said window of said plasma chamber into said plasma chamber.

15. The apparatus as claimed in claim 6, further comprising a branch type rectangular waveguide, mounted between said microwave generating means and one end of said coupling rectangular waveguide and between said microwave generating means and another end of said coupling rectangular waveguide, said branch type rectangular waveguide propagating the microwave from said microwave generating means into both ends of said coupling rectangular waveguide.

16. The apparatus as claimed in claim 6, further comprising magnetic field generating means for generating a magnetic field on a propagation path between said window of said plasma chamber and said object to be processed on which the microwave propagates through said window of said plasma chamber into said plasma chamber.

17. The apparatus as claimed in claim 7, further comprising a branch type rectangular waveguide, mounted between said microwave generating means and one end of said coupling rectangular waveguide and between said microwave generating means and another end of said coupling rectangular waveguide, said branch type rectangular waveguide propagating the microwave from said microwave generating means into both ends of said coupling rectangular waveguide.

18. The apparatus as claimed in claim 7, further comprising magnetic field generating means for generating a magnetic field on a propagation path between said window of said plasma chamber and said object to be processed on which the microwave propagates through said window of said plasma chamber into said plasma chamber.

19. The apparatus as claimed in claim 8, further comprising a pair of movable connecting means movably mounted respectively between said branch type rectangular waveguide and one end of said coupling rectangular waveguide and between said branch type rectangular waveguide and another end of said coupling rectangular waveguide, so as to change a length of a waveguide path between said branch type rectangular waveguide and one end of said coupling rectangular waveguide and a length of another waveguide path between said branch type rectangular waveguide and another end of said coupling rectangular waveguide, thereby a phase of a standing wave generated in said coupling rectangular waveguide when the microwave propagates in said coupling rectangular waveguide.

20. The apparatus as claimed in claim 9, further comprising divergent magnetic field generating means for generating a divergent magnetic field directing from the center of said window of said plasma chamber toward said plasma chamber.

21. The apparatus as claimed in claim 10, further comprising magnetic field generating means for generating a magnetic field on a propagation path between said window of said plasma chamber and said object to be processed on which the microwave propagates through said window of said plasma chamber into said plasma chamber.

22. The apparatus as claimed in claim 11, further comprising divergent magnetic field generating means for generating a divergent magnetic field directing from the center of said window of said plasma chamber toward said plasma chamber.

23. The apparatus as claimed in claim 13, further comprising a pair of movable connecting means movably mounted respectively between said branch type rectangular waveguide and one end of said coupling rectangular waveguide and between said branch type rectangular waveguide and another end of said coupling rectangular waveguide, so as to change a length of a waveguide path between said branch type rectangular waveguide and one end of said coupling rectangular waveguide and a length of another waveguide path between said branch type rectangular waveguide and another end of said coupling rectangular waveguide, thereby a phase of a standing wave generated in said coupling rectangular waveguide when the microwave propagates in said coupling rectangular waveguide.

24. The apparatus as claimed in claim 14, further comprising divergent magnetic field generating means for generating a divergent magnetic field directing from the center of said window of said plasma chamber toward said plasma chamber.

25. The apparatus as claimed in claim 15, further comprising a pair of movable connecting means movably mounted respectively between said branch type rectangular waveguide and one end of said coupling rectangular waveguide and between said branch type rectangular waveguide and another end of said coupling rectangular waveguide, so as to change a length of a waveguide path between said branch type rectangular waveguide and one end of said coupling rectangular waveguide and a length of another waveguide path between said branch type rectangular waveguide and another end of said coupling rectangular waveguide, thereby a phase of a standing wave generated in said coupling rectangular waveguide when the microwave propagates in said coupling rectangular waveguide.

26. The apparatus as claimed in claim 16, further comprising divergent magnetic field generating means for generating a divergent magnetic field directing from the center of said window of said plasma chamber toward said plasma chamber.

27. The apparatus as claimed in claim 17, further comprising a pair of movable connecting means movably mounted respectively between said branch type rectangular waveguide and one end of said coupling rectangular waveguide and between said branch type rectangular waveguide and another end of said coupling rectangular waveguide, so as to change a length of a waveguide path between said branch type rectangular waveguide and one end of said coupling rectangular waveguide and a length of another waveguide path between said branch type rectangular waveguide and another end of said coupling rectangular waveguide, thereby a phase of a standing wave generated in said coupling rectangular waveguide when the microwave propagates in said coupling rectangular waveguide.

28. The apparatus as claimed in claim 18, further comprising divergent magnetic field generating means for generating a divergent magnetic field directing from the center of said window of said plasma chamber toward said plasma chamber.

29. The apparatus as claimed in claim 21, further comprising divergent magnetic field generating means for generating a divergent magnetic field directing from the center of said window of said plasma chamber toward said plasma chamber.

* * * * *

UNITED STATES PATENT AND TRADEMARK OFFICE
CERTIFICATE OF CORRECTION

PATENT NO. : 5,315,212
DATED : May 24, 1994
INVENTOR(S) : Akira Ishii, et al.

It is certified that error appears in the above-indentified patent and that said Letters Patent is hereby corrected as shown below:

Column 3, line 68: "waveguide." should read --waveguide, said branch type rectangular waveguide propagating the microwave from said microwave generating means into both ends of said coupling rectangular waveguide.--

Column 8, line 45: "shaft 3" should read --shaft 33--

Column 10, line 37: delete "I"

Column 13, line 37: "1" should read --71--

Column 16, line 65: "18bis" should read --18b is--

Column 18, line 41, Claim 3: delete "a"

Column 19, line 28, Claim 8: "ne" should read --one--

Signed and Sealed this

Twenty-seventh Day of December, 1994

Attest:

BRUCE LEHMAN

Attesting Officer     Commissioner of Patents and Trademarks